(12) United States Patent
Chakrapani et al.

(10) Patent No.: US 11,411,389 B1
(45) Date of Patent: Aug. 9, 2022

(54) SYSTEMS AND METHODS FOR A CONTROLLED DYNAMIC MHO DISTANCE CHARACTERISTIC

(71) Applicant: GENERAL ELECTRIC TECHNOLOGY GMBH, Baden (CH)

(72) Inventors: Venkatesh Chakrapani, Stafford (GB); Ilia Voloh, Markham (CA)

(73) Assignee: General Electric Technology GmbH, Baden (CH)

( * ) Notice: Subject to any disclaimer, the term of this patent is extended or adjusted under 35 U.S.C. 154(b) by 0 days.

(21) Appl. No.: 17/201,066

(22) Filed: Mar. 15, 2021

(51) Int. Cl.
  *H02H 3/40* (2006.01)
  *H02H 7/28* (2006.01)
  *G01R 31/08* (2020.01)

(52) U.S. Cl.
  CPC .......... *H02H 3/402* (2013.01); *G01R 31/088* (2013.01); *H02H 7/28* (2013.01)

(58) Field of Classification Search
  CPC ......... H02H 3/402; H02H 7/28; G01R 31/088
  See application file for complete search history.

(56) References Cited

U.S. PATENT DOCUMENTS

| | | | | |
|---|---|---|---|---|
| 4,342,064 A | * | 7/1982 | Wilkinson | H02H 3/382 361/85 |
| 4,344,143 A | * | 8/1982 | Kurosawa | H02H 3/40 700/293 |
| 4,477,855 A | * | 10/1984 | Nakayama | H02H 3/06 361/115 |
| 4,821,137 A | * | 4/1989 | Wilkinson | H02H 3/385 361/76 |
| 5,140,492 A | | 8/1992 | Schweitzer | |
| 5,367,426 A | * | 11/1994 | Schweitzer, III | H02H 7/26 324/522 |
| 6,239,959 B1 | * | 5/2001 | Alexander | H02H 3/402 361/85 |

(Continued)

FOREIGN PATENT DOCUMENTS

| CN | 104300514 A | 1/2015 |
|---|---|---|
| EP | 1976089 A2 | 10/2008 |

OTHER PUBLICATIONS

Calero, Fernando, "Distance Elements: Linking Theory with Testing," 2009 62nd Annual Conference for Protective Relay Engineers, Austin, TX, 2009, pp. 333-352.

(Continued)

*Primary Examiner* — Scott Bauer
(74) *Attorney, Agent, or Firm* — Eversheds Sutherland (US) LLP

(57) ABSTRACT

Systems, methods, and computer-readable media are disclosed for identifying a fault using systems and methods for a controlled dynamic MHO characteristic. Particularly, the systems and methods described herein may automatically control the dynamic expansion of the MHO characteristic based on the estimation of uncontrolled dynamic MHO expansion estimation and maximum allowable expansion set by a user. This may provide flexibility in that, the MHO can be allowed to expand to a maximum level, when the estimated MHO expansion value is below the user defined maximum allowable expansion level, but also provides a controlled dynamic MHO when the estimated values are above the maximum allowable level.

20 Claims, 6 Drawing Sheets

(56) References Cited

U.S. PATENT DOCUMENTS

| | | |
|---|---|---|
| 8,022,709 B2 | 9/2011 | Wahlroos et al. |
| 2003/0039086 A1* | 2/2003 | Kase ...................... H02H 3/081 |
| | | 361/65 |
| 2008/0239602 A1* | 10/2008 | Kasztenny ............. H02H 3/402 |
| | | 361/65 |
| 2014/0236502 A1 | 8/2014 | Calero et al. |
| 2016/0334469 A1 | 11/2016 | Calero et al. |
| 2020/0106261 A1 | 4/2020 | Kasztenny et al. |

OTHER PUBLICATIONS

Calero, Fernando et al., "Identifying the Proper Impedance Plane and Fault Trajectories in Distance Protection Analysis," 2012 66th Annual Georgia Tech Protective Relay Conference, Atlanta, GA 2012, 14 pages.

Cook, "Generalised method of assessing ploarising signals for the polarised-mho relay," in Proceedings of the Institution of Electrical Engineers, vol. 122, No. 5, pp. 497-500, May 1975, 4 pages.

D60 Technical Manual, 2 pages.

P443 Technical Manual, 1 page.

\* cited by examiner

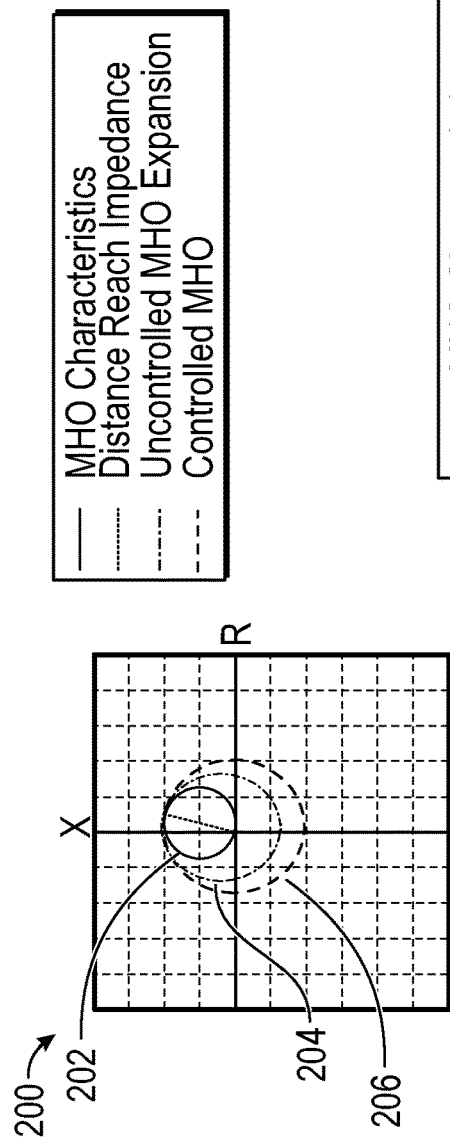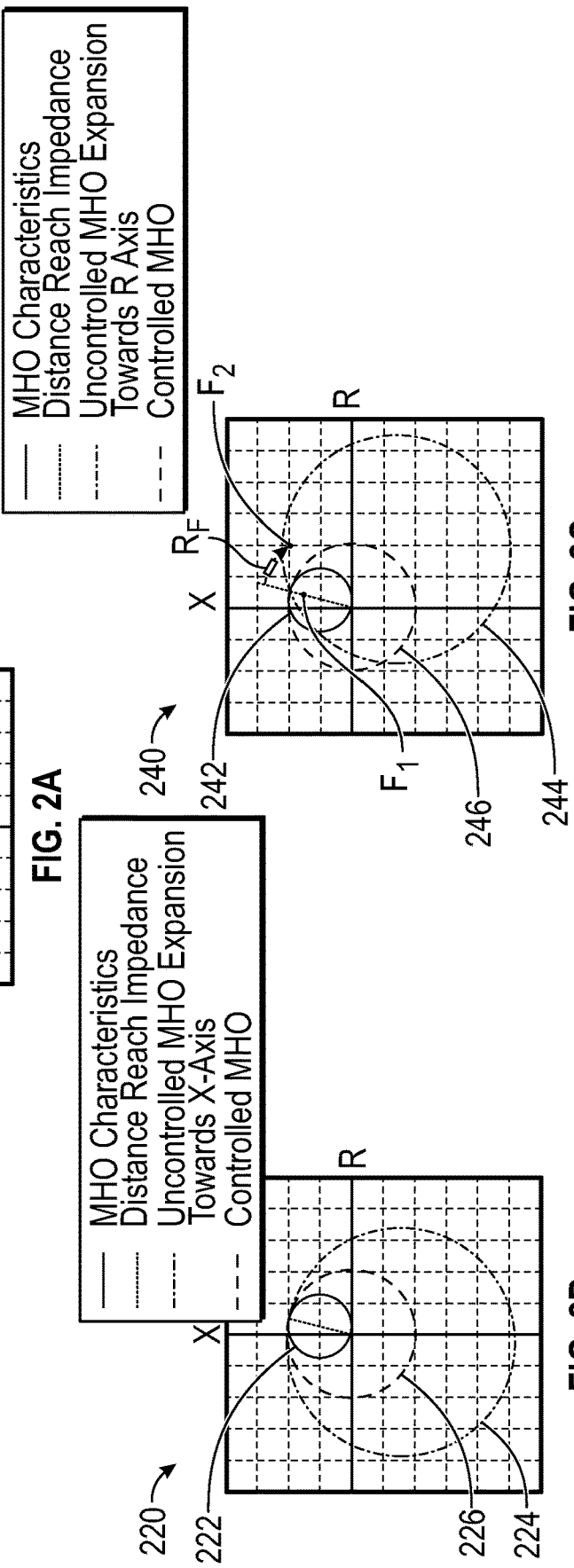

US 11,411,389 B1

SYSTEMS AND METHODS FOR A CONTROLLED DYNAMIC MHO DISTANCE CHARACTERISTIC

TECHNICAL FIELD

The disclosure relates to fault identification in electric power delivery systems, and, more particularly, relates to fault identification in electric power delivery systems using a controlled dynamic MHO characteristic.

BACKGROUND

Distance relays with a MHO or quadrilateral characteristic are primarily used to protect transmission lines. Although technology evolution, i.e., digital and numerical, has opened-up the possibility to construct and realize other, more complex characteristics, such as closed polygons (for example, quadrilateral and directional), the MHO characteristic is still used due to its ease of setting the characteristic, and especially when the quadrilateral characteristic is not reliable. The MHO characteristic, which is constructed using operating and polarizing quantities, is directly impacted by the choice of the polarizing quantity i.e. the characteristic is dynamic and no longer static. This dynamic characteristic results in large expansion when the source is weak, which may result in incorrect operation due to over-reaching. In the presence of non-standard sources, e.g. inverter-based sources, the change in the source magnitude and angle during fault further aggravates the problem resulting in an uncontrolled dynamic MHO.

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral may identify the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

FIGS. 2A-2C depict MHO characteristic plots, in accordance with one or more example embodiments of the disclosure.

DETAILED DESCRIPTION

This disclosure may relate to, among other things, identifying a fault using systems and methods for a controlled dynamic MHO characteristic. Particularly, the systems and methods described herein may automatically control the dynamic expansion of the MHO characteristic based on the estimation of uncontrolled dynamic MHO expansion and maximum allowable expansion set by a user. This may provide certain technical solutions having flexibility in that, the MHO can be allowed to expand to a maximum level, when the estimated MHO expansion value is below the user defined maximum allowable expansion level, but also provides a controlled dynamic MHO when the estimated values are above the maximum allowable level (for example, the MHO may be prevented from expanding above the maximum allowable level).

Figure 1:
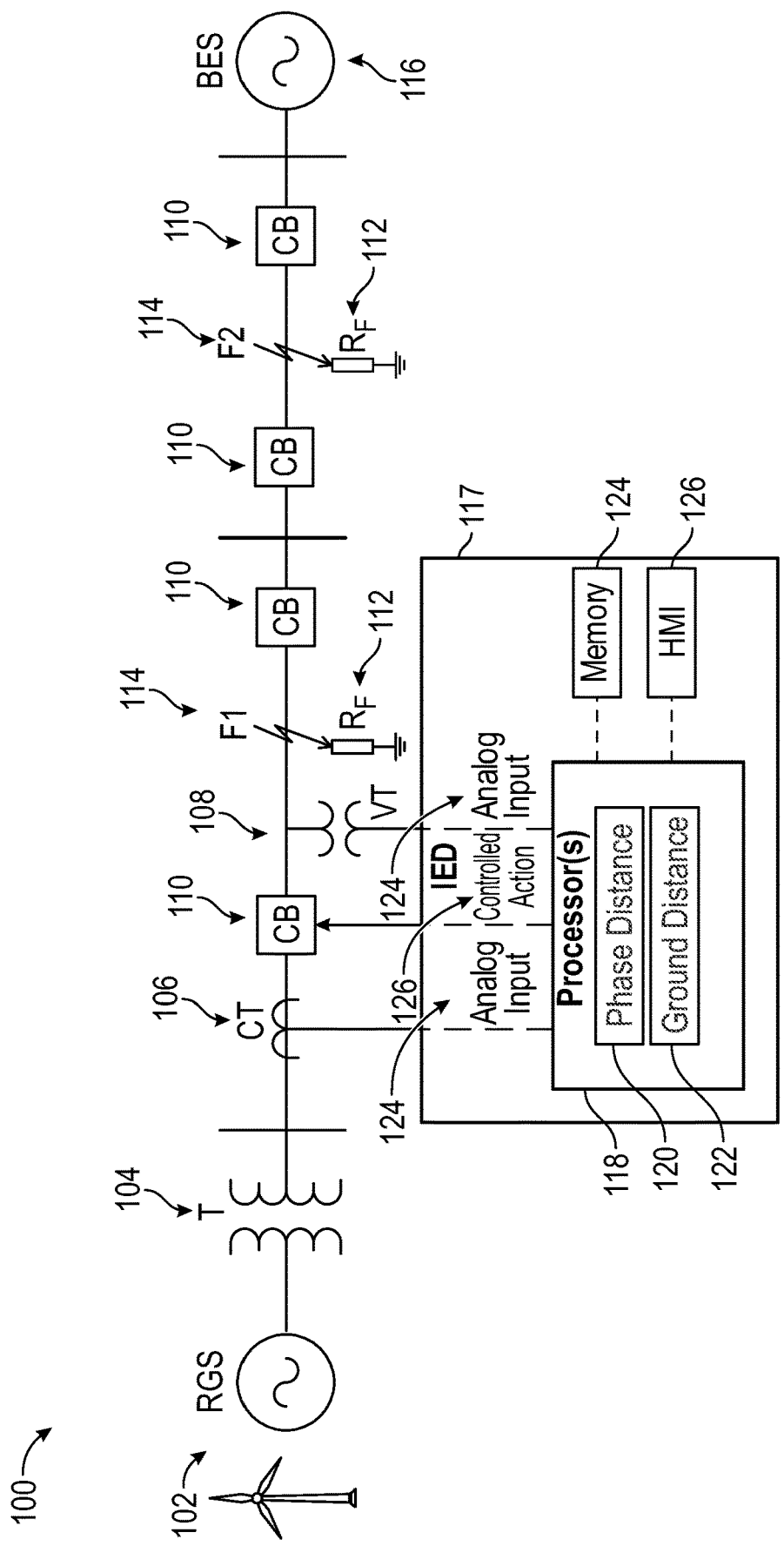
FIG. 1 depicts a schematic illustration of an example system, in accordance with one or more example embodiments of the disclosure.

Turning to the figures, FIG. 1 illustrates an example system 100 according to an embodiment of the disclosure. In some embodiments, the system 100 may include one or more renewable power generation source(s) 102, one or more current transformer(s) 106, one or more voltage transformer(s) 108, one or more step-up transformers 104, one or more circuit breaker(s) 110, and one or more bulk electrical systems 116. Additionally, there may exist one or more line fault(s) 114 in the system 100, which may be associated with one or more fault resistance(s) 112. In some cases, the system 100 may also include an intelligent electronic device (IED) 117. The IED may include one or more processor(s) 118, which may be used for phase distance 120 and ground distance 122 calculations. The IED 117 may also include memory 124 and/or a human-machine interface (HMI) 126. The IED 117 (as well as any other element included in the system 100) may also include any elements described with respect to the computing device 500 of FIG. 5.

FIGS. 2A-2C depict example MHO characteristic plots (a first plot 200 associated with FIG. 2A, a second plot 220 associated with FIG. 2B, and a third plot 240 associated with FIG. 2C). These plots depict a static MHO characteristic, a uncontrolled MHO characteristic, and a controlled MHO characteristic based on the maximum allowed MHO expansion (which may be pre-set by a user), The MHO 202 may represent a static MHO characteristic. The first plot 200 may be a plot depicting a uncontrolled dynamic MHO characteristic 204 that has expanded less than the maximum allowed MHO expansion 206. In this situation, the MHO characteristic 204 may be left uncontrolled. That is, the MHO characteristic 204 may be allowed to expand in an uncontrolled manner until it expands beyond the maximum allowed MHO expansion 206 established by the user. The second plot 220 may be a plot depicting a uncontrolled dynamic MHO characteristic 224 that has expanded towards the negative X axis beyond the maximum allowed MHO expansion 226. In this situation, the MHO characteristic 224 may be controlled such that it does not expand beyond the MHO expansion 226. The third plot 240 may be a plot depicting a uncontrolled dynamic MHO characteristic 244 that has expanded towards the positive R axis. Again, in this situation, the MHO characteristic 244 may be controlled such that it does not expand beyond the MHO expansion 246.

In some embodiments, the controlled dynamic MHO may be achieved by automatically estimating the factors 'E' and 'P' in Equation 1 below, which may define the dual polarizing scheme.

$$V_{pol} = E \cdot V_{loop} + P \cdot V_{1M} \quad \text{(Equation 1)},$$

where $V_{pol}$ may refer to a polarizing quantity, $V_{1M}$ may refer to a positive sequence memorized voltage, $V_{loop}$ may be a loop voltage, and the "E" and "P" variables may be user set variables. Loop voltages or currents here may represent AB, BC, CA voltages or currents for phase distance elements and AG, BG, CG voltages or currents for ground distance elements.

In some embodiments, the MHO characteristic can be established using the following comparators in Equations 2 and 3 below.

$$S_1 = IZ - V \quad \text{(Equation 2)}$$

$$S_2 = V_{pol} \quad \text{(Equation 3)},$$

where V and I may be the fault loop voltage and current respectively and Z may be the positive sequence impedance of the protected line, $V_{pol}$ may be the polarizing voltage (which may be single or dual). The polarizing voltage may be based on any of (or a mix of) the following: loop voltages, loop voltages stored in memory before fault, positive sequence loop voltage, positive sequence loop voltage stored in memory, healthy phase voltages, and/or healthy phase voltages stored in memory. The "E" and "P" variables in Equation 1 may be set based on the estimated expansion and the user defined maximum allowable expansion. The amount of expansion is initially estimated using Equations 4 and 5 below. Equation 4 may represent ground elements and Equation 5 may be represent phase elements. The a and b vector included in these equations (as well as other Equations defined herein) may be a function of impedance, and the present value of a and b may define an amount of expansion at a given point in time for ground and phase elements respectively.

$$a = \left[ \left[ \frac{V_2 + V_0 - I_1 Z_{s1}}{I_{loop}} \right] \right] \quad \text{(Equation 4)}$$

$$b = -Z_{s1} \quad \text{(Equation 5)},$$

where, $Z_{s1}$ may refer to positive sequence source impedance, $V_2$ may refer to the negative sequence voltage, $V_0$ may refer to the zero sequence voltage, $I_1$ may refer to the positive sequence current, $I_{loop}$ may refer to the loop currents estimated by the relay.

If the estimated expansion is less than the user defined maximum allowable expansion or if the MHO control is set to a uncontrolled mode of operation, then the expansion may be dictated by Equations 4 and 5 for ground and phase elements respectively. This may be achieved by setting E to 0 and P to 1 in Equation 1. If the estimated expansion is more than the user defined maximum allowable expansion and if the MHO control is set to an controlled mode of operation, then the controlled expansion may be dictated by c and d values of Equations 6 and 7 below for ground and phase elements respectively. This may be achieved by setting E to 1 and P to the respective value determined through Equation 8 below.

$$c = \left[ \frac{P}{1+P} \right] * a \quad \text{(Equation 6)}$$

$$d = \left[ \frac{P}{1+P} \right] * b \quad \text{(Equation 7)}$$

$$P = -\left[ \frac{\frac{C_1}{C_2}}{1 - \frac{C_1}{C_2}} \right] \quad \text{(Equation 8)}$$

where $C_1$ may refer to a desired expansion level (from setting) and $C_2$ may refer to an actual expansion level determined by a and b values (using Equations 6 and 7 for ground and phase elements respectively).

Figure 3A:
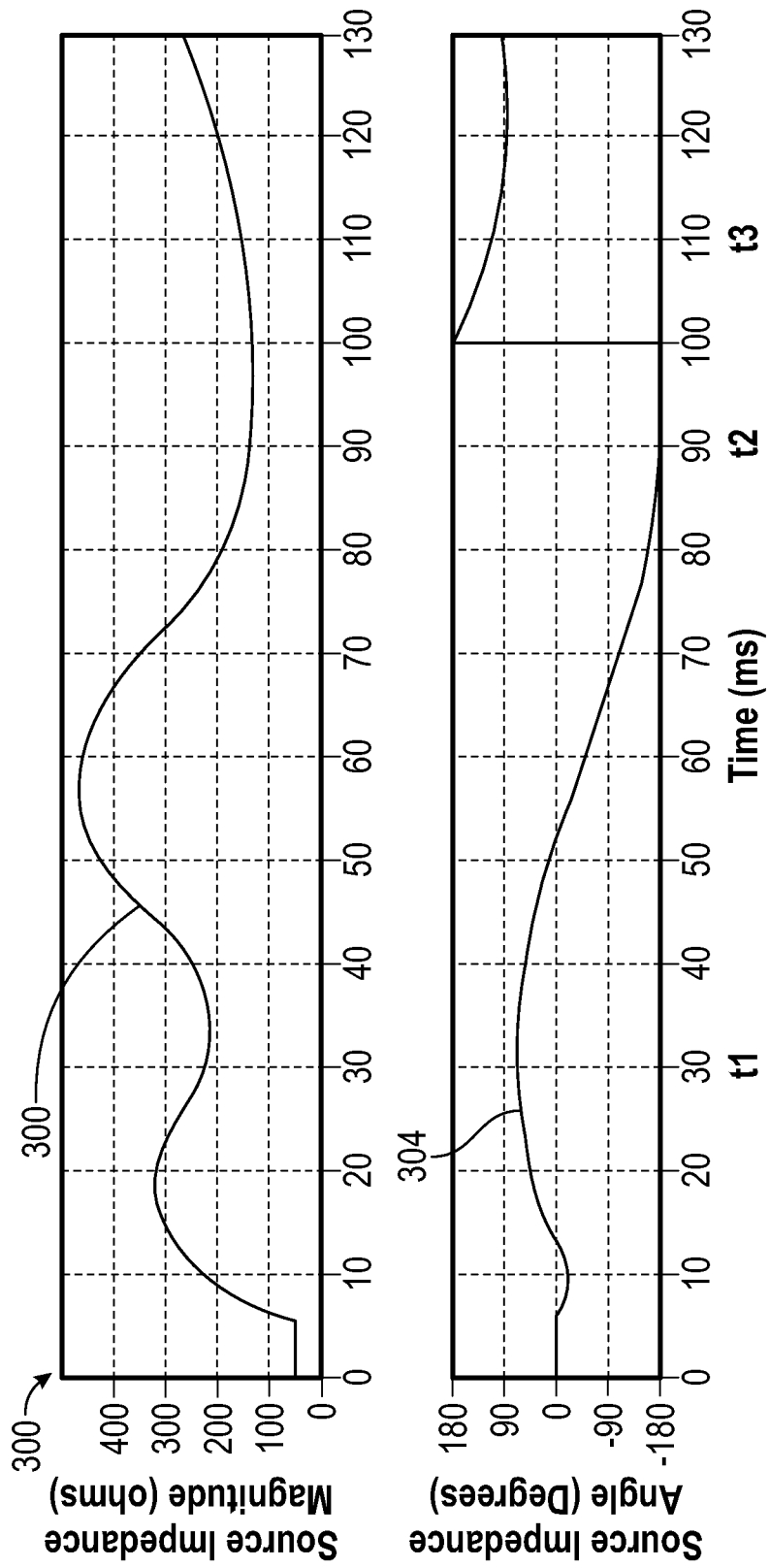
FIG. 3A depicts a plot illustrating the variation of source impedance magnitude and angle during a fault, in accordance with one or more example embodiments of the disclosure.
Figure 3B:
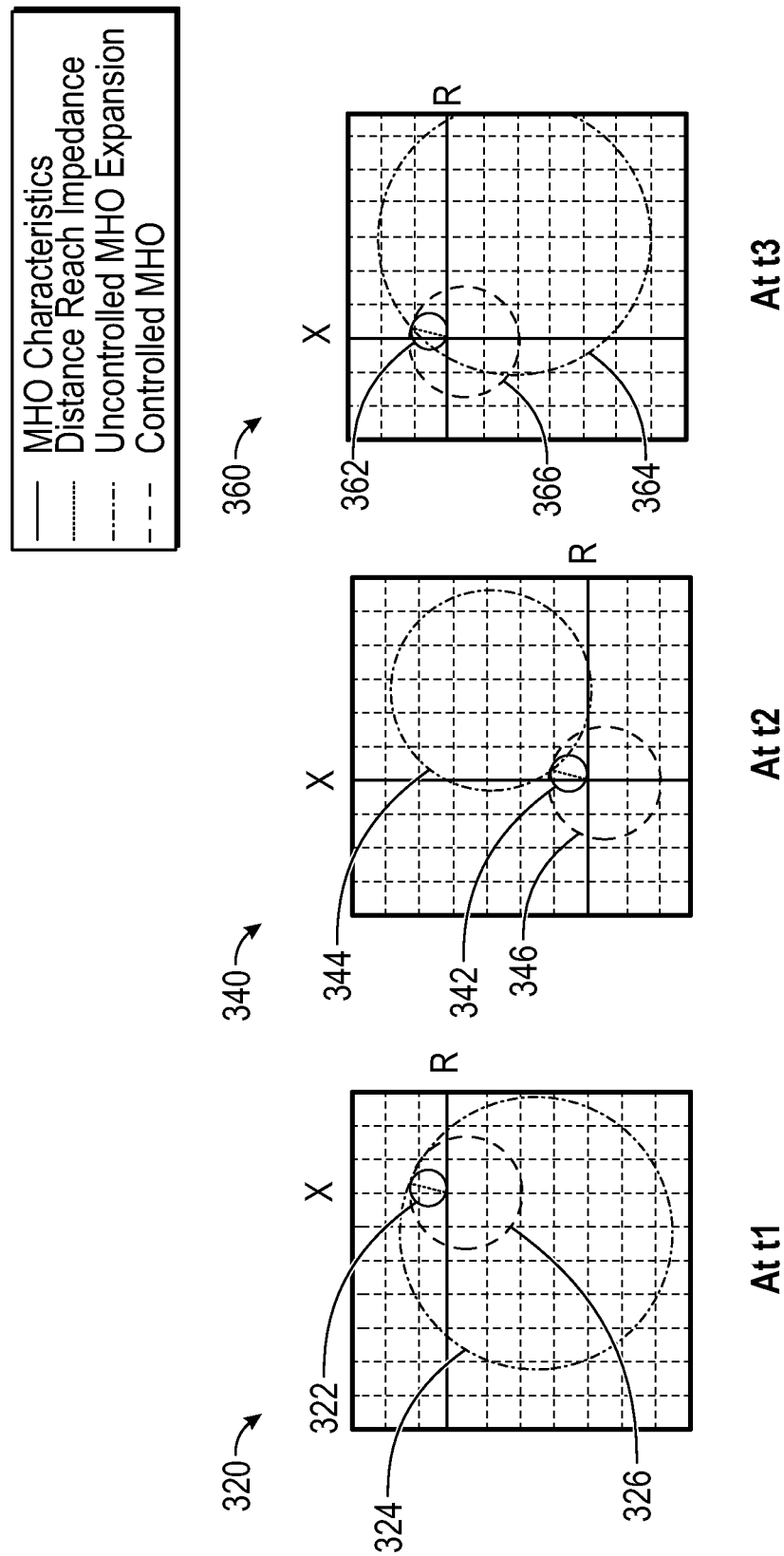
FIG. 3B depicts additional MHO characteristic plots, in accordance with one or more example embodiments of the disclosure.

FIG. 3A depicts a plot 300 illustrating the example variation of source impedance magnitude and angle during a fault in the presence of non-standard source. FIG. 3B depicts additional MHO characteristic plots. The plot 320 may be a plot depicting the uncontrolled MHO behavior 324 at time $t_1$, that has expanded beyond the maximum allowed MHO expansion 326. In this situation, MHO control is active and limits the MHO expansion 326 towards negative X axis. The plot 340 may be a plot depicting the uncontrolled MHO expansion 344 at time $t_2$, that has expanded in the positive R and X axis. In this situation, MHO control is active and limits the MHO 342, by setting E=1 and P=0. The plot 360 may be a plot depicting the uncontrolled MHO expansion at time $t_3$, that has expanded towards the positive R axis. Again, MHO control may be active in this situation, to limit the expansion beyond 366

Figure 4:
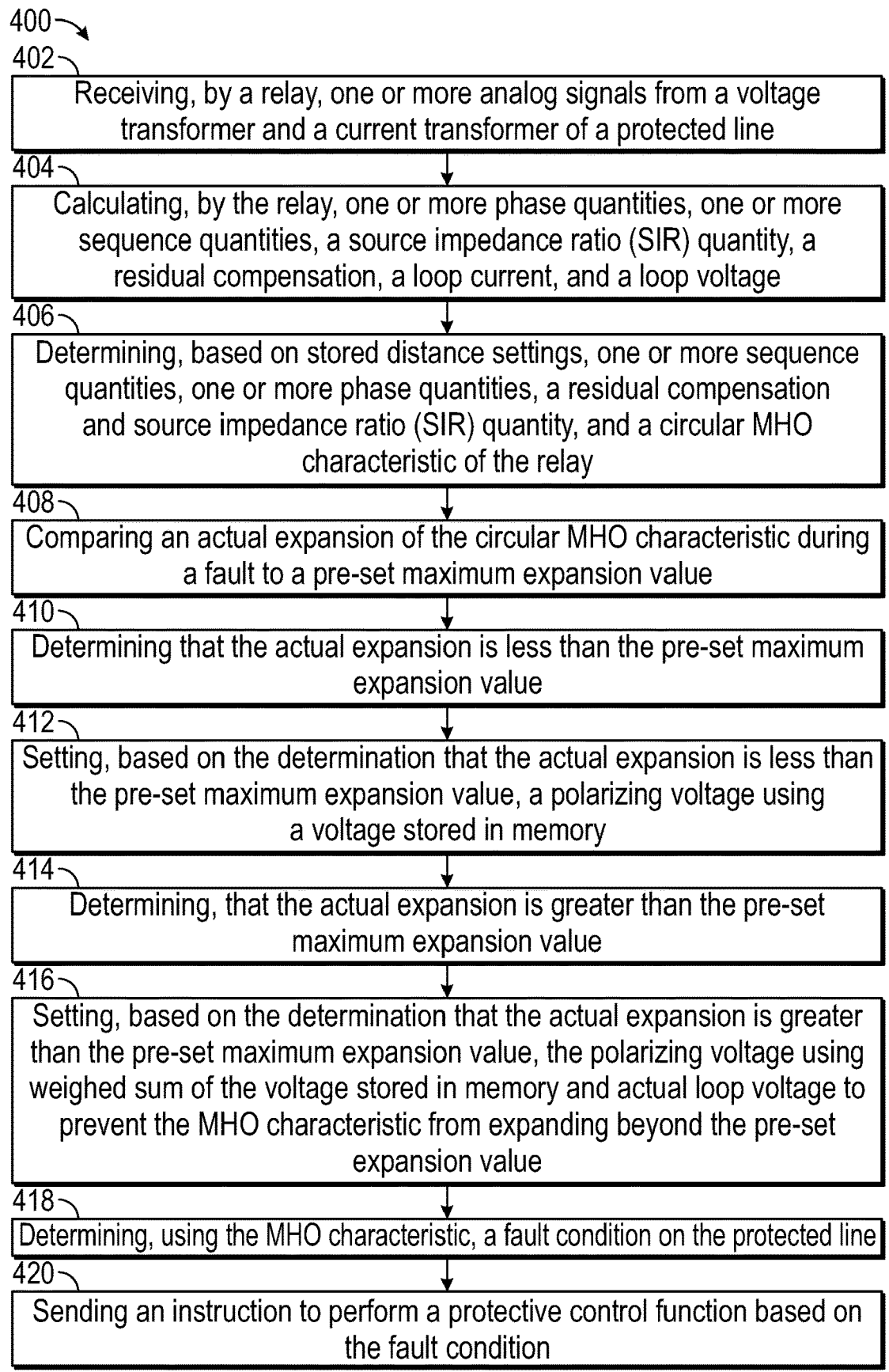
FIG. 4 depicts an example method, in accordance with one or more example embodiments of the disclosure.

FIG. 4 depicts an example method 400 according to an example embodiment of the disclosure. At block 402 in FIG. 4, the method 400 may include receiving, by a relay, one or more analog signals from a voltage transformer and a current transformer of a protected line. The method 400 may also include calculating, by the relay, one or more phase quantities, one or more sequence quantities, a source impedance ratio (SIR) quantity, a residual compensation, a loop currents, and loop voltages. The method 400 may also include determining, based on stored distance settings, one or more sequence quantities, one or more phase quantities, a residual compensation and source impedance ratio (SIR) quantity, and a circular MHO characteristic of the relay. The method 400 may also include comparing an actual expansion of the circular MHO characteristic during a fault to a pre-set maximum expansion value. At block 410 in FIG. 4, the method 400 may also include determining that the actual expansion is less than the pre-set maximum expansion value. The method 400 may also include setting, based on the determination that the actual expansion is less than the pre-set maximum expansion value, a polarizing voltage using a voltage stored in memory. The method 400 may also include determining, that the actual expansion is greater than the pre-set maximum expansion value. The method 400 may also include setting, based on the determination that the actual expansion is greater than the pre-set maximum expansion value, the polarizing voltage using weighed sum of the voltage stored in memory and actual loop voltage to prevent the MHO characteristic from expanding beyond the pre-set expansion value. The method 400 may also include determining, using the controlled MHO characteristic, a fault condition on the protected line. The method 400 may also include sending an instruction to perform a protective control function based on the fault condition.

In some embodiments, the polarizing voltage during the fault is determined based on a sum of a product of a first weighting factor and the loop voltage, and a product of a second weighting factor and the voltage stored in memory, and wherein setting the polarizing voltage using dual polarization comprises setting the first weighting factor to a value of zero and the second weighting factor to a value of one based on a determination that the actual expansion during fault is less than the pre-set maximum expansion value. In some embodiments, the polarizing voltage is determined based on a sum of a product of a first weighting factor and the loop voltage, and a product of a second weighting factor and the voltage stored in memory, and wherein setting the polarizing voltage using the dual polarization comprises setting the first weighting factor to a value of one and the second weighting factor to a value to a non-zero value based on a determination that the actual expansion during fault is greater than the pre-set maximum expansion value. In some embodiments, the non-zero value is based on a pre-set maximum expansion amount and an actual expansion amount. In some embodiments, the actual expansion for a ground fault is determined using, stored distance settings, residual compensation, sequence quantities, phase quantities and source impedance ratio (SIR) quantity. In some embodiments, the actual expansion for a phase fault is determined using, source impedance ratio (SIR) quantity and stored distance settings. In some embodiments, determining the fault condition further comprises determining that estimated apparent impedance falls within the circular MHO characteristic.

In some embodiments, a protective control function can include changing or altering an electrical characteristic, such as voltage, to protect a transmission line. In some instances, a protective control function can include controlling, such as switching, a breaker or other power transmission equipment associated with a transmission line.

Figure 5:
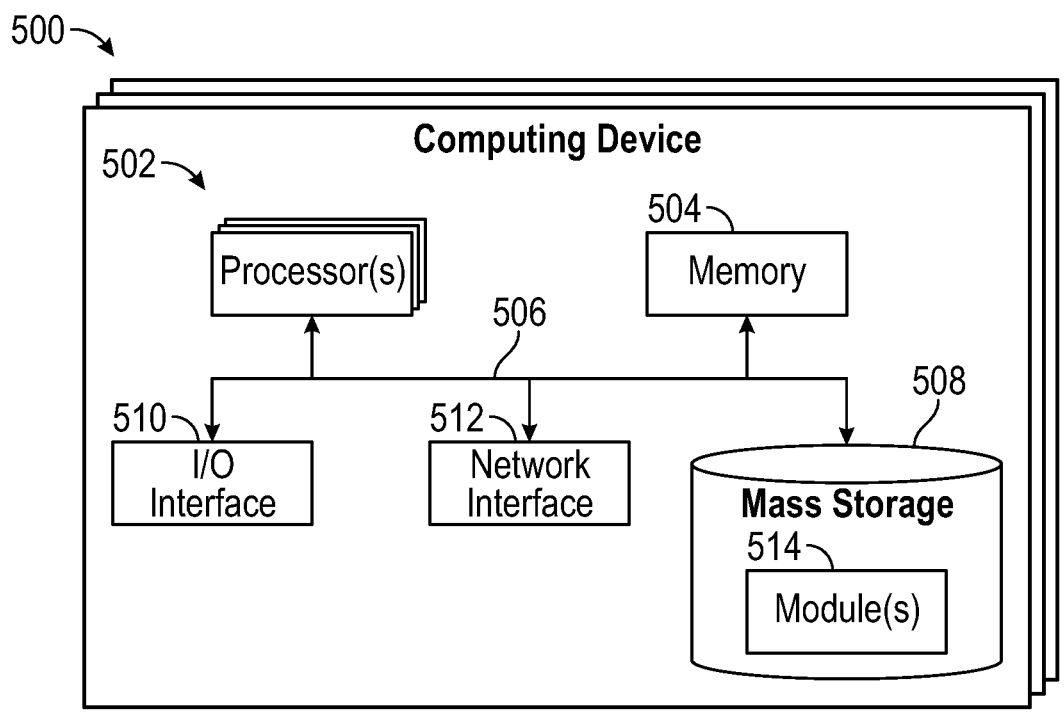
FIG. 5 depicts a schematic illustration of an example computing system and device architecture, in accordance with one or more example embodiments of the disclosure.

FIG. 5 illustrates an example computing system and device 500, in accordance with one or more embodiments of this disclosure. The computing device 500 may be representative of any number of elements described herein, such as the IED 117, or any other element described herein. The computing device 500 may include one or more processors 502 that execute instructions that are stored in one or more memory devices (referred to as memory 504). The instructions can be, for instance, instructions for implementing functionality described as being carried out by one or more modules and systems disclosed above or instructions for implementing one or more of the methods disclosed above. The one or more processors 502 can be embodied in, for example, a CPU, multiple CPUs, a GPU, multiple GPUs, a TPU, multiple TPUs, a multi-core processor, a combination thereof, and the like. In some embodiments, the one or more processors 502 can be arranged in a single processing device. In other embodiments, the one or more processors 502 can be distributed across two or more processing devices (e.g., multiple CPUs; multiple GPUs; a combination thereof; or the like). A processor can be implemented as a combination of processing circuitry or computing processing units (such as CPUs, GPUs, or a combination of both). Therefore, for the sake of illustration, a processor can refer to a single-core processor; a single processor with software multithread execution capability; a multi-core processor; a multi-core processor with software multithread execution capability; a multi-core processor with hardware multithread technology; a parallel processing (or computing) platform; and parallel computing platforms with distributed shared memory. Additionally, or as another example, a processor can refer to an integrated circuit (IC), an ASIC, a digital signal processor (DSP), an FPGA, a PLC, a complex programmable logic device (CPLD), a discrete gate or transistor logic, discrete hardware components, or any combination thereof designed or otherwise configured (e.g., manufactured) to perform the functions described herein.

The one or more processors 502 can access the memory 504 by means of a communication architecture 506 (e.g., a system bus). The communication architecture 506 may be suitable for the particular arrangement (localized or distributed) and types of the one or more processors 502. In some embodiments, the communication architecture 506 can include one or many bus architectures, such as a memory bus or a memory controller; a peripheral bus; an accelerated graphics port; a processor or local bus; a combination thereof, or the like. As an illustration, such architectures can include an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, a Peripheral Component Interconnect (PCI) bus, a PCI-Express bus, a Personal Computer Memory Card International Association (PCMCIA) bus, a Universal Serial Bus (USB), and/or the like.

Memory components or memory devices disclosed herein can be embodied in either volatile memory or non-volatile memory or can include both volatile and non-volatile memory. In addition, the memory components or memory devices can be removable or non-removable, and/or internal or external to a computing device or component. Examples of various types of non-transitory storage media can include hard-disc drives, zip drives, CD-ROMs, digital versatile disks (DVDs) or other optical storage, magnetic cassettes, magnetic tape, magnetic disk storage or other magnetic storage devices, flash memory cards or other types of memory cards, cartridges, or any other non-transitory media suitable to retain the desired information and which can be accessed by a computing device.

As an illustration, non-volatile memory can include read-only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The disclosed memory devices or memories of the operational or computational environments described herein are intended to include one or more of these and/or any other suitable types of memory. In addition to storing executable instructions, the memory 504 also can retain data.

Each computing device 500 also can include mass storage 508 that is accessible by the one or more processors 502 by means of the communication architecture 506. The mass storage 508 can include machine-accessible instructions (e.g., computer-readable instructions and/or computer-executable instructions). In some embodiments, the machine-accessible instructions may be encoded in the mass storage 508 and can be arranged in components that can be built (e.g., linked and compiled) and retained in computer-executable form in the mass storage 508 or in one or more other machine-accessible non-transitory storage media included in the computing device 500. Such components can embody, or can constitute, one or many of the various modules disclosed herein. Such modules are illustrated as modules 514. Additionally, protocols such as Modbus, DNP, IEC 60870, IEC 61850, Profibus, Fieldbus, etc. may be used in conjunction with the systems and methods described herein.

Execution of the modules 514, individually or in combination, by the one more processors 502, can cause the computing device 500 to perform any of the operations described herein (for example, the operations described with respect to FIG. 4, as well as any other operations).

Each computing device 500 also can include one or more input/output interface devices 510 (referred to as I/O interface 510) that can permit or otherwise facilitate external devices to communicate with the computing device 500. For instance, the I/O interface 510 may be used to receive and send data and/or instructions from and to an external computing device.

The computing device 500 also includes one or more network interface devices 512 (referred to as network interface(s) 512) that can permit or otherwise facilitate functionally coupling the computing device 500 with one or more external devices. Functionally coupling the computing device 500 to an external device can include establishing a wireline connection or a wireless connection between the computing device 500 and the external device. The network interface devices 512 can include one or many antennas and a communication processing device that can permit wireless communication between the computing device 500 and another external device. For example, between a vehicle and a smart infrastructure system, between two smart infrastructure systems, etc. Such a communication processing device can process data according to defined protocols of one or several radio technologies. The radio technologies can include, for example, 3G, Long Term Evolution (LTE), LTE-Advanced, 5G, IEEE 802.11, IEEE 802.16, Bluetooth, ZigBee, near-field communication (NFC), and the like. The communication processing device can also process data according to other protocols as well, such as vehicle-to-infrastructure (V2I) communications, vehicle-to-vehicle (V2V) communications, and the like. The network interface(s) 512 may also be used to facilitate peer-to-peer ad-hoc network connections as described herein.

As used in this application, the terms "environment," "system," "unit," "module," "architecture," "interface," "component," and the like refer to a computer-related entity or an entity related to an operational apparatus with one or more defined functionalities. The terms "environment," "system," "module," "component," "architecture," "interface," and "unit," can be utilized interchangeably and can be generically referred to functional elements. Such entities may be either hardware, a combination of hardware and software, software, or software in execution. As an example, a module can be embodied in a process running on a processor, a processor, an object, an executable portion of software, a thread of execution, a program, and/or a computing device. As another example, both a software application executing on a computing device and the computing device can embody a module. As yet another example, one or more modules may reside within a process and/or thread of execution. A module may be localized on one computing device or distributed between two or more computing devices. As is disclosed herein, a module can execute from various computer-readable non-transitory storage media having various data structures stored thereon. Modules can communicate via local and/or remote processes in accordance, for example, with a signal (either analogic or digital) having one or more data packets (e.g., data from one component interacting with another component in a local system, distributed system, and/or across a network such as a wide area network with other systems via the signal).

As yet another example, a module can be embodied in or can include an apparatus with a defined functionality provided by mechanical parts operated by electric or electronic circuitry that is controlled by a software application or firmware application executed by a processor. Such a processor can be internal or external to the apparatus and can execute at least part of the software or firmware application. Still, in another example, a module can be embodied in or can include an apparatus that provides defined functionality through electronic components without mechanical parts. The electronic components can include a processor to execute software or firmware that permits or otherwise facilitates, at least in part, the functionality of the electronic components.

In some embodiments, modules can communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, modules can communicate or otherwise be coupled via thermal, mechanical, electrical, and/or electro-mechanical coupling mechanisms (such as conduits, connectors, combinations thereof, or the like). An interface can include input/output (I/O) components as well as associated processors, applications, and/or other programming components.

Further, in the present specification and annexed drawings, terms such as "store," "storage," "data store," "data storage," "memory," "repository," and substantially any other information storage component relevant to the operation and functionality of a component of the disclosure, refer to memory components, entities embodied in one or several memory devices, or components forming a memory device. It is noted that the memory components or memory devices described herein embody or include non-transitory computer storage media that can be readable or otherwise accessible by a computing device. Such media can be implemented in any methods or technology for storage of information, such as machine-accessible instructions (e.g., computer-readable instructions), information structures, program modules, or other information objects.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of systems, devices, techniques, and computer program products that, individually and in combination, permit the automated provision of an update for a vehicle profile package. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

That which is claimed is:

1. A system comprising:
    a computer processor operable to execute a set of computer-readable instructions; and
    a memory operable to store the set of computer-readable instructions operable to:
        receive, by a relay, one or more analog signals from a voltage transformer and a current transformer of a protected line;
        calculate, by the relay, one or more phase quantities, one or more sequence quantities, a source impedance ratio (SIR) quantity, a residual compensation, loop currents, and loop voltages;
        determine, based on stored distance settings, one or more sequence quantities, one or more phase quantities, a residual compensation and source impedance ratio (SIR) quantity, and a circular MHO characteristic of the relay;
        compare an actual expansion of the circular MHO characteristic during a fault to a pre-set maximum expansion value;
        determine that the actual expansion is less than the pre-set maximum expansion value;
        set, based on the determination that the actual expansion is less than the pre-set maximum expansion value, a polarizing voltage using a voltage stored in memory;
        determine, that the actual expansion is greater than the pre-set maximum expansion value;
        set, based on the determination that the actual expansion is greater than the pre-set maximum expansion value, the polarizing voltage using weighed sum of the voltage stored in memory and actual loop voltage to prevent the MHO characteristic from expanding beyond the pre-set expansion value;
        determine, using the MHO characteristic, a fault condition on the protected line; and
        send an instruction to perform a protective control function based on the fault condition.

2. The system of claim 1, wherein the polarizing voltage during the fault is determined based on a sum of a product of a first weighting factor and the loop voltage, and a product of a second weighting factor and the voltage stored in memory, and wherein setting the polarizing voltage using dual polarization comprises setting the first weighting factor to a value of zero and the second weighting factor to a value of one based on a determination that the actual expansion during fault is less than the pre-set maximum expansion value.

3. The system of claim 1, wherein the polarizing voltage is determined based on a sum of a product of a first weighting factor and the loop voltage, and a product of a second weighting factor and the voltage stored in memory, and wherein setting the polarizing voltage using the dual polarization comprises setting the first weighting factor to a value of one and the second weighting factor to a value to a non-zero value based on a determination that the actual expansion during fault is greater than the pre-set maximum expansion value.

4. The system of claim 3, wherein the non-zero value is based on a pre-set maximum expansion amount and an actual expansion amount.

5. The system of claim 1, wherein the actual expansion for a ground fault is determined using, stored distance settings, residual compensation, sequence quantities, phase quantities and source impedance ratio (SIR) quantity.

6. The system of claim 1, wherein the actual expansion for a phase fault is determined using, source impedance ratio (SIR) quantity and stored distance settings.

7. The system of claim 1, wherein determining the fault condition in the system further comprises determining that estimated apparent impedance falls within the circular MHO characteristic.

8. A method comprising:
    receiving, by a relay, one or more analog signals from a voltage transformer and a current transformer of a protected line;
    calculating, by the relay, one or more phase quantities, one or more sequence quantities, a source impedance ratio (SIR) quantity, a residual compensation, loop currents, and loop voltages;
    determining, based on stored distance settings, one or more sequence quantities, one or more phase quantities, a residual compensation and source impedance ratio (SIR) quantity, and a circular MHO characteristic of the relay;
    comparing an actual expansion of the circular MHO characteristic during a fault to a pre-set maximum expansion value;
    determining that the actual expansion is less than the pre-set maximum expansion value;
    setting, based on the determination that the actual expansion is less than the pre-set maximum expansion value, a polarizing voltage using a voltage stored in memory;
    determining, that the actual expansion is greater than the pre-set maximum expansion value;
    setting, based on the determination that the actual expansion is greater than the pre-set maximum expansion value, the polarizing voltage using weighed sum of the voltage stored in memory and actual loop voltage to prevent the MHO characteristic from expanding beyond the pre-set expansion value;
    determining, using the MHO characteristic, a fault condition on the protected line; and
    sending an instruction to perform a protective control function based on the fault condition.

9. The method of claim 8, wherein the polarizing voltage during the fault is determined based on a sum of a product of a first weighting factor and the loop voltage, and a product of a second weighting factor and the voltage stored in memory, and wherein setting the polarizing voltage using dual polarization comprises setting the first weighting factor to a value of zero and the second weighting factor to a value of one based on a determination that the actual expansion during fault is less than the pre-set maximum expansion value.

10. The method of claim 8, wherein the polarizing voltage is determined based on a sum of a product of a first weighting factor and the loop voltage, and a product of a second weighting factor and the voltage stored in memory, and wherein setting the polarizing voltage using the dual polarization comprises setting the first weighting factor to a value of one and the second weighting factor to a value to a non-zero value based on a determination that the actual expansion during fault is greater than the pre-set maximum expansion value.

11. The method of claim 10, wherein the non-zero value is based on a pre-set maximum expansion amount and an actual expansion amount.

12. The method of claim 8, wherein the actual expansion for a ground fault is determined using, stored distance settings, residual compensation, sequence quantities, phase quantities and source impedance ratio (SIR) quantity.

13. The method of claim 8, wherein the actual expansion for a phase fault is determined using, source impedance ratio (SIR) quantity and stored distance settings.

14. The method of claim 8, wherein determining the fault condition further comprises determining that estimated apparent impedance falls within the circular MHO characteristic.

15. A non-transitory computer-readable medium storing computer-executable instructions, that when executed by at least one processor, cause the at least one processor to perform operations of:
  receiving, by a relay, one or more analog signals from a voltage transformer and a current transformer of a protected line;
  calculating, by the relay, one or more phase quantities, one or more sequence quantities, a source impedance ratio (SIR) quantity, a residual compensation, loop currents, and loop voltages;
  determining, based on stored distance settings, one or more sequence quantities, one or more phase quantities, a residual compensation and source impedance ratio (SIR) quantity, and a circular MHO characteristic of the relay;
  comparing an actual expansion of the circular MHO characteristic during a fault to a pre-set maximum expansion value;
  determining that the actual expansion is less than the pre-set maximum expansion value;
  setting, based on the determination that the actual expansion is less than the pre-set maximum expansion value, a polarizing voltage using a voltage stored in memory;
  determining, that the actual expansion is greater than the pre-set maximum expansion value;
  setting, based on the determination that the actual expansion is greater than the pre-set maximum expansion value, the polarizing voltage using weighed sum of the voltage stored in memory and actual loop voltage to prevent the MHO characteristic from expanding beyond the pre-set expansion value;
  determining, using the MHO characteristic, a fault condition on the protected line; and
  sending an instruction to perform a protective control function based on the fault condition.

16. The non-transitory computer-readable medium of claim 15, wherein the polarizing voltage during the fault is determined based on a sum of a product of a first weighting factor and the loop voltage, and a product of a second weighting factor and the voltage stored in memory, and wherein setting the polarizing voltage using dual polarization comprises setting the first weighting factor to a value of zero and the second weighting factor to a value of one based on a determination that the actual expansion during fault is less than the pre-set maximum expansion value.

17. The non-transitory computer-readable medium of claim 15, wherein the polarizing voltage is determined based on a sum of a product of a first weighting factor and the loop voltage, and a product of a second weighting factor and the voltage stored in memory, and wherein setting the polarizing voltage using the dual polarization comprises setting the first weighting factor to a value of one and the second weighting factor to a value to a non-zero value based on a determination that the actual expansion during fault is greater than the pre-set maximum expansion value.

18. The non-transitory computer-readable medium of claim 17, wherein the non-zero value is based on a pre-set maximum expansion amount and an actual expansion amount.

19. The non-transitory computer-readable medium of claim 15, wherein the actual expansion for a ground fault is determined using, stored distance settings, residual compensation, sequence quantities, phase quantities and source impedance ratio (SIR) quantity.

20. The non-transitory computer-readable medium of claim 15, wherein the actual expansion for a phase fault is determined using, source impedance ratio (SIR) quantity and stored distance settings.

* * * * *